(12) United States Patent
Kobayashi et al.

(10) Patent No.: US 9,779,809 B2
(45) Date of Patent: **\*Oct. 3, 2017**

(54) RESISTIVE SEMICONDUCTOR MEMORY DEVICE AND OPERATION METHOD THEREOF

(71) Applicant: Toshiba Memory Corporation, Minato-ku (JP)

(72) Inventors: Shigeki Kobayashi, Kuwana (JP); Takeshi Yamaguchi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/361,763

(22) Filed: Nov. 28, 2016

(65) Prior Publication Data

US 2017/0076792 A1   Mar. 16, 2017

Related U.S. Application Data

(63) Continuation of application No. 14/666,360, filed on Mar. 24, 2015, now Pat. No. 9,520,166, which is a
(Continued)

(30) Foreign Application Priority Data

Aug. 3, 2012  (JP) ................................. 2012-173302

(51) Int. Cl.
  *G11C 13/00*  (2006.01)
  *G11C 7/22*  (2006.01)
  *G11C 11/00*  (2006.01)

(52) U.S. Cl.
  CPC .............. *G11C 13/004* (2013.01); *G11C 7/22* (2013.01); *G11C 13/0004* (2013.01);
(Continued)

(58) Field of Classification Search
  CPC .............. G11C 13/004; G11C 13/0069; G11C 13/0026; G11C 13/0028; G11C 2213/71; G11C 2213/72; G11C 2013/0054
  See application file for complete search history.

(56) References Cited

U.S. PATENT DOCUMENTS 7,209,379 B2   4/2007   Mori et al.
7,907,436 B2   3/2011   Maejima et al.
(Continued)

FOREIGN PATENT DOCUMENTS

JP    2011-54223    3/2011
JP    2011-54259    3/2011
(Continued)

OTHER PUBLICATIONS

Japanese Office Action issued Mar. 17, 2015 in Patent Application No. 2012-173302 (w/English translation).

*Primary Examiner* — Harry W Byrne
*Assistant Examiner* — Ajay Ojha
(74) *Attorney, Agent, or Firm* — Oblon, McClelland, Maier & Neustadt, L.L.P.

(57) ABSTRACT

A semiconductor memory device includes a control circuit configured to apply a first voltage to a selected first line, apply a second voltage to a selected second line, and apply a third voltage and a fourth voltage to a non-selected first line and a non-selected second line in a setting operation, respectively. The control circuit includes a detection circuit configured to detect a transition of a resistance state of a selected memory cell using a reference voltage. The control circuit is configured to execute a read operation in which the control circuit applies the third voltage to the selected first line and the non-selected first line, applies the second voltage to the selected second line, and applies the fourth
(Continued)

voltage to the non-selected second line, and set the reference voltage based on a voltage value of the selected second line.

17 Claims, 13 Drawing Sheets

Related U.S. Application Data continuation of application No. 13/848,969, filed on Mar. 22, 2013, now Pat. No. 9,001,556.

(52) U.S. Cl.
CPC ...... *G11C 13/0021* (2013.01); *G11C 13/0026* (2013.01); *G11C 13/0028* (2013.01); *G11C 13/0064* (2013.01); *G11C 13/0069* (2013.01); *G11C 11/00* (2013.01); *G11C 2013/0054* (2013.01); *G11C 2013/0057* (2013.01); *G11C 2213/71* (2013.01); *G11C 2213/72* (2013.01)

(56) References Cited

U.S. PATENT DOCUMENTS

| | | |
|---|---|---|
| 8,228,712 B2 | 7/2012 | Baba |
| 8,270,201 B2 | 9/2012 | Sasaki |
| 8,345,466 B2 | 1/2013 | Maejima et al. |
| 8,369,130 B2 | 2/2013 | Maejima |
| 2008/0094876 A1 | 4/2008 | Siau et al. |
| 2008/0151601 A1 | 6/2008 | Kang |
| 2009/0323393 A1 | 12/2009 | Scheuerlein |
| 2010/0085799 A1 | 4/2010 | Cho |
| 2011/0194328 A1 | 8/2011 | Kim et al. |
| 2011/0235394 A1 | 9/2011 | Sasaki et al. |
| 2012/0033480 A1 | 2/2012 | Hosono |

FOREIGN PATENT DOCUMENTS

| | | |
|---|---|---|
| JP | 2011-108327 | 6/2011 |
| JP | 2011-134383 | 7/2011 |
| JP | 2011-175716 | 9/2011 |

Setting Operation

RESISTIVE SEMICONDUCTOR MEMORY DEVICE AND OPERATION METHOD THEREOF

CROSS REFERENCE TO RELATED APPLICATION

This application is a continuation of and claims the benefit of priority under 35 U.S.C. §120 from U.S. Ser. No. 14/666,360 filed Mar. 24, 2015, which is a continuation of U.S. Ser. No. 13/848,969 filed Mar. 22, 2013 (now U.S. Pat. No. 9,001,556 issued Apr. 7, 2015), and claims the benefit of priority under 35 U.S.C. §119 from Japanese Patent Application No. 2012-173302 filed Aug. 3, 2012, the entire contents of each of which are incorporated herein by reference.

BACKGROUND

Field

Embodiments described in the present specification relate to a semiconductor memory device configured as an arrangement of memory cells each storing data by a change in resistance value of a variable resistance element, and an operation method thereof.

Description of the Related Art

In recent years, a resistance varying memory device employing a variable resistance element as a storage element has been receiving attention as a successor candidate of flash memory. Now, it is assumed that the resistance varying memory device, as well as including a resistance varying memory in a narrow sense, that is, a resistance varying memory that configures a transition metal oxide as a recording layer and stores a resistance value state of the transition metal oxide in a nonvolatile manner (ReRAM: Resistive RAM), includes also a phase change memory that employs chalcogenide or the like as a recording layer and uses resistance value information of a crystalline state (conductor) and an amorphous state (insulator) of the chalcogenide or the like (PCRAM: Phase Change RAM), and so on.

A memory cell array in a resistance varying memory device has memory cells disposed at intersections of bit lines and word lines, each memory cell being configured from a variable resistance element and a current rectifier element such as a diode or the like. In such a memory cell array, selection of a memory cell can be performed using the current rectifier element such as a diode or the like. Moreover, it is also possible for a high-density memory cell array to be realized by alternately stacking the bit lines and word lines to configure a three-dimensional stacked arrangement of memory cell arrays.

A resistance state of a recording layer in a resistance varying memory is changed by applying a voltage/current to the recording layer. Therefore, during a write operation, unless it is quickly detected that the resistance state of the recording layer has changed and the voltage/current application discontinued, an excessive electrical stress is applied to the recording layer, whereby a functional decline of the recording layer occurs. Accordingly, when a write operation is executed on a memory cell to change the resistance state, it must be quickly detected that the resistance state of the variable resistance element in the memory cell has changed, and thereby avoid, as far as possible, application of an unnecessary operational voltage. Detection of a change in resistance value of the variable resistance element is performed by, for example, detecting a voltage value of the bit line connected to the memory cell. Preparing a certain reference voltage and detecting when there is a reversal in magnitudes of the voltage value of the bit line connected to the memory cell and the voltage value of the reference voltage allows the change in resistance value of the memory cell to be detected.

In a memory cell array having memory cells arranged at intersections of bit lines and word lines, when a write operation is executed on a selected memory cell, the voltage state of the selected bit line and the selected word line change according to a resistance state of non-selected memory cells surrounding the selected memory cell. In view of the change in voltage state of the selected bit line and the selected word line, the reference voltage must be designed with a considerable margin. This makes it difficult to set the reference voltage employed for detecting whether the resistance state of the selected memory cell has undergone transition or not. There is also a possibility that, in the case where the voltage value of the reference voltage deviates from the voltage of the bit line connected to the selected memory cell around a time of the operation, the change in resistance state cannot be accurately detected. As a result, an excessive voltage is applied to the selected memory cell resulting in the memory cell being destroyed.

DETAILED DESCRIPTION

A semiconductor memory device according to an embodiment comprises: a memory cell array including a plurality of first lines disposed on a substrate, a plurality of second lines disposed intersecting the first lines, and memory cells disposed at each of intersections of the first lines and the second lines and each configured having a current rectifier element and a variable resistance element connected in series therein; and a control circuit configured to apply a first voltage to a selected first line, apply a second voltage having a voltage value which is smaller than that of the first voltage to a selected second line, and apply a third voltage and a fourth voltage to a non-selected first line and a non-selected second line in a setting operation, respectively, such that a first potential difference is applied to a selected memory cell disposed at the intersection of the selected first line and the selected second line. The control circuit includes a detection circuit configured to, during the setting operation, detect a transition of a resistance state of the selected memory cell using a reference voltage. The control circuit is configured to, before the setting operation, execute a read operation in which the control circuit applies the third voltage to the selected first line and the non-selected first line, applies the second voltage to the selected second line, and applies the fourth voltage to the non-selected second line, and set the reference voltage based on a voltage value of the selected second line during the read operation.

Next, embodiments of the present invention are described in detail with reference to the drawings. Note that in the descriptions of the drawings in the embodiments below, identical symbols are assigned to places having an identical configuration, and duplicated descriptions of such places are omitted.

[Overall Configuration]

Figure 1:
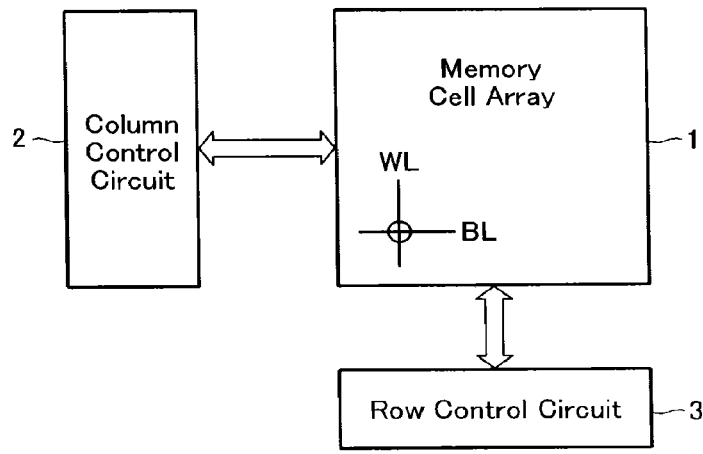
FIG. 1 is one example of a block diagram of a semiconductor memory device according to a first embodiment of the present invention.

FIG. 1 is one example of a block diagram showing a configuration of a nonvolatile memory according to a first embodiment of the present invention. This nonvolatile memory comprises a memory cell array 1 having memory cells disposed in a matrix therein, each of the memory cells using a variable resistance element VR to be described later.

A column control circuit 2 is electrically connected to a bit line BL of the memory cell array 1 in order to select the bit line BL of the memory cell array 1 and perform data erase of the memory cell, data write to the memory cell, and data read from the memory cell for the sake of controlling a voltage of the bit line BL. Moreover, a row control circuit 3 is electrically connected to a word line WL of the memory cell array 1 in order to select the word line WL of the memory cell array 1 and perform data erase of the memory cell, data write to the memory cell, and data read from the memory cell for the sake of controlling a voltage of the word line WL.

[Memory Cell Array 1]

Figure 2:
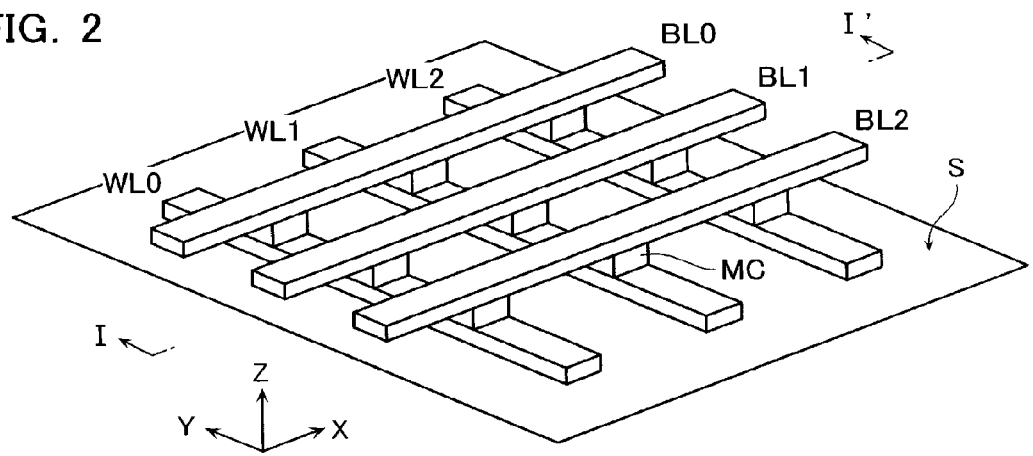
FIG. 2 is one example of a perspective view of part of a memory cell array 1.
Figure 3:
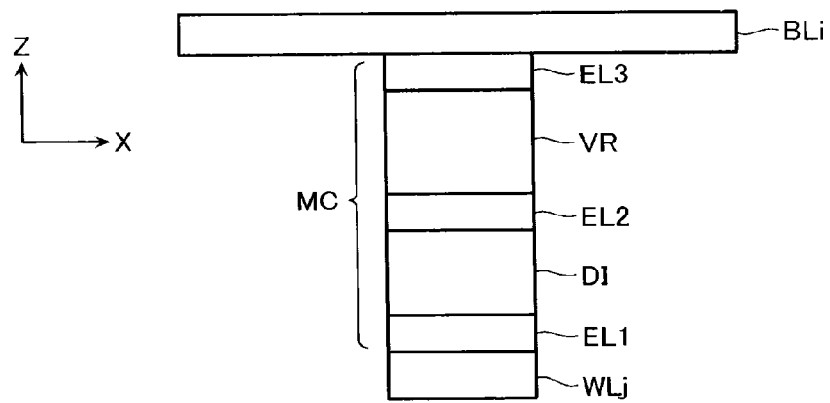
FIG. 3 is one example of a cross-sectional view taken along the line I-I' and looking in the direction of the arrows in FIG. 2, showing a single memory cell portion.

FIG. 2 is one example of a perspective view of part of the memory cell array 1, and FIG. 3 is one example of a cross-sectional view taken along the line I-I' and looking in the direction of the arrows in FIG. 2, showing a single memory cell portion. Word lines WL0~WL2 acting as a plurality of first lines are arranged in a Y direction parallel to a surface of a semiconductor substrate S. Bit lines BL0~BL2 acting as a plurality of second lines are arranged in an X direction parallel to the surface of the semiconductor substrate S so as to intersect the word lines WL. A memory cell MC is disposed at each of intersections of the word lines WL0~WL2 and the bit lines BL0~BL2 so as to be sandwiched by both lines. The first and second lines are preferably of a material which is heat-resistant and has a low resistance value. For example, W, WN, WSi, NiSi, CoSi, and so on, may be employed as the material.

[Memory Cell MC]

As shown in FIG. 3, the memory cell MC is a circuit having a variable resistance element VR and a current rectifier element, for example, a diode DI, or the like, connected in series in a Z direction perpendicular to the semiconductor substrate S. Disposed above and below the variable resistance element VR and the diode DI are electrodes EL1, EL2, and EL3 functioning as a barrier metal and an adhesive layer. The diode DI is disposed on the electrode EL1, and the electrode EL2 is disposed on the diode DI. The variable resistance element VR is disposed on the electrode EL2, and the electrode EL3 is disposed on the variable resistance element VR. Employable as an electrode material of the electrodes EL1, EL2, and EL3 is, for example, titanium nitride (TiN). Moreover, it is also possible for a different material to be adopted for each of the materials of the electrodes EL1, EL2, and EL3. For example, the following may also be employed as the material of the electrodes, namely Pt, Au, Ag, TiAlN, SrRuO, Ru, RuN, Ir, Co, Ti, TaN, LaNiO, Al, PtIrO$_x$, PtRhO$_x$, Rh, TaAlN, W, WN, TaSiN, TaSi$_2$, TiSi, TiC, TaC, Nb—TiO$_2$, NiSi, CoSi, conductive silicon including an impurity, and so on. Moreover, insertion of a metal film to make orientation uniform is also possible. Moreover, inserting a separate buffer layer, barrier metal layer, adhesive layer, and so on, is also possible. Furthermore, a structure that changes an order in the Z direction of the diode DI and the variable resistance element VR is also included in embodiments of the present invention.

[Variable Resistance Element]

Employed as the variable resistance element VR is a substance capable of having its resistance value changed via an electric field, a current, heat, chemical energy, and so on, by application of a voltage. For example, the variable resistance element VR may employ a metal oxide, such as hafnium oxide (HfO$_x$), manganese oxide (MnO$_2$), titanium oxide (TiO$_x$), niobium oxide (NbO$_x$), aluminum oxide (AlO$_x$), nickel oxide (NiO), tantalum oxide (TaO$_x$), or tungsten oxide (WO).

[Current Rectifier Element]

The current rectifier element employed in the memory cell MC is not specifically limited regarding a material, structure and so on, provided it is an element having a current rectifying characteristic in its current-voltage characteristics. One example of the current rectifier element is a diode DI manufactured by polysilicon (Poly-Si). Employable as the diode DI is, for example, a PIN diode having a p-type layer and an n-type layer that include impurities, and an i layer inserted between these p-type and n-type layers that does not include an impurity. Moreover, the following may also be employed as the diode DI, namely a PN junction diode comprising a p-type layer and an n-type layer, various kinds of diodes such as a Schottky diode, a punch-through diode, and so on.

[Memory Cell Array and its Peripheral Circuits]

Figure 4:
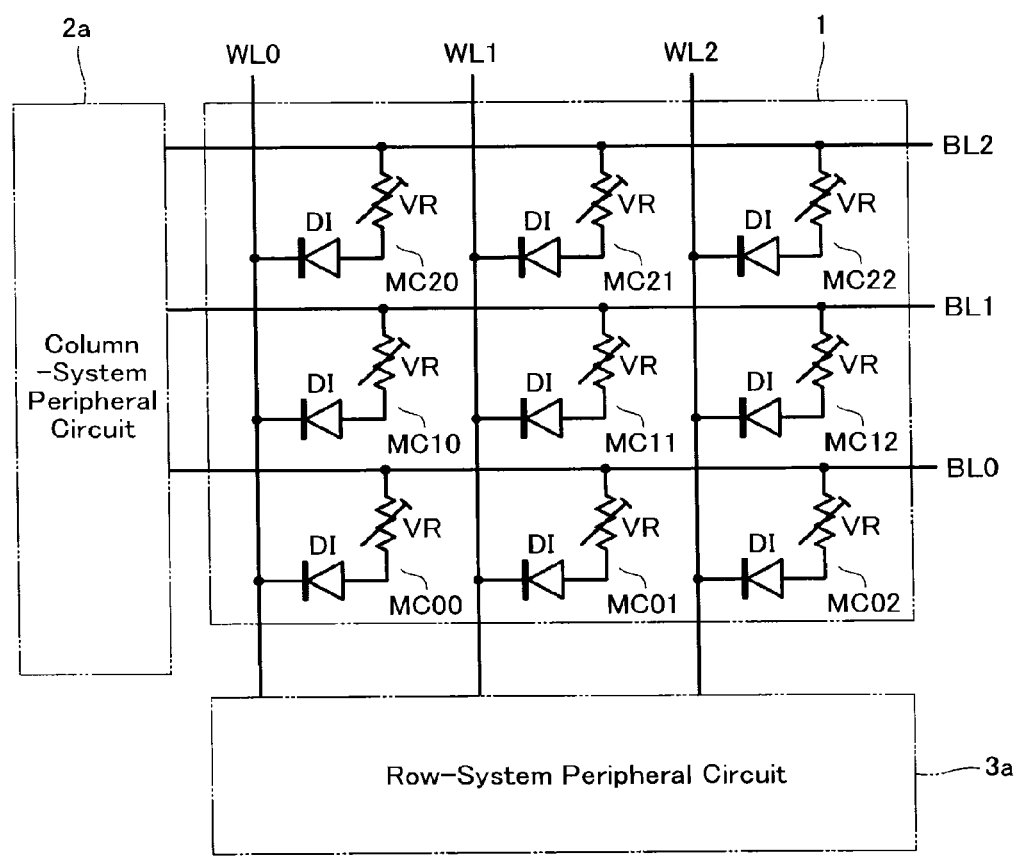
FIG. 4 is one example of a circuit diagram of the memory cell array 1 and a peripheral circuit of the memory cell array 1.

FIG. 4 is one example of a circuit diagram of the memory cell array 1 and its peripheral circuits. In FIG. 4, the memory cell MC is configured by the variable resistance element VR and the diode DI. The diode DI has a current rectifying characteristic such that current flows through a selected memory cell MC from a selected bit line BL to a selected word line WL. One end of each of the bit lines BL is connected to a column-system peripheral circuit 2a which is part of the column control circuit 2. In addition, one end of each of the word lines WL is connected to a row-system peripheral circuit 3a which is part of the row control circuit 3. Voltages required in operations on the bit lines BL and the word lines WL are supplied by these column-system peripheral circuit 2a and row-system peripheral circuit 3a. The column-system peripheral circuit 2a and the row-system peripheral circuit 3a may each be appended with a different function required in operational control of the bit lines BL and the word lines WL.

[Example of Stacked Memory Cell Array]

Figure 5:
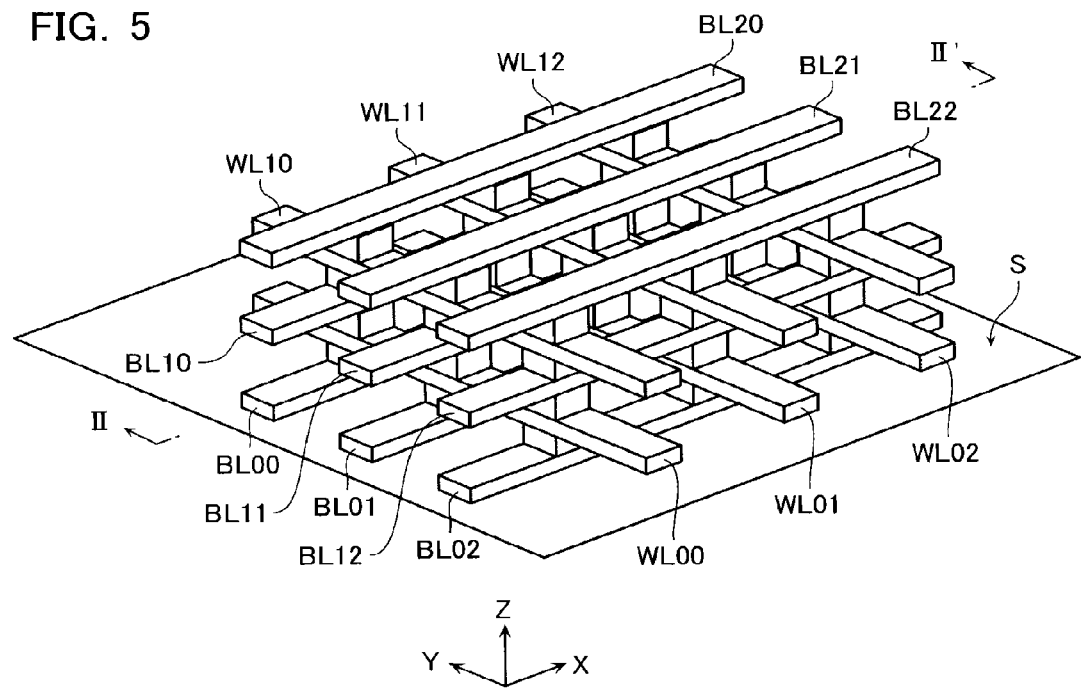
FIG. 5 is one example of a perspective view of part of a memory cell array 1 in a separate example of configuration.
Figure 6:
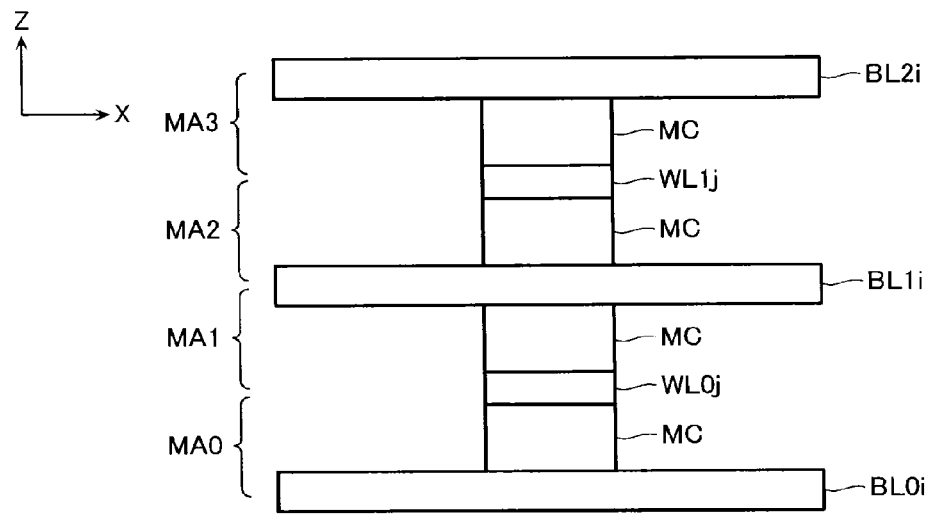
FIG. 6 is one example of a cross-sectional view taken along the line II-II' and looking in the direction of the arrows in FIG. 5.

As shown in FIG. 5, a three-dimensional structure having the above-described memory cell structure stacked multiply in the Z direction may also be adopted. FIG. 6 is one example of a cross-sectional view showing the II-II' cross-section in FIG. 5. The example illustrated is a memory cell array having a four-layer structure configured from cell array layers MA0~MA3. A word line WL0$j$ is shared by the memory cell MC in the cell array layers MA0 and MA1 below and above the word line WL0$j$, a bit line BL1$i$ is shared by the memory cell MC in the cell array layers MA1 and MA2 below and above the bit line BL1$i$, and a word line WL1$j$ is shared by the memory cell MC in the cell array layers MA2 and MA3 below and above the word line WL1$j$. Note that the previously mentioned column control circuit 2 and row control circuit 3 may be provided to each of the cell array layers MA or may be shared by the cell array layers MA.

[Setting Operation]

One example of operations according to the present embodiment are described below with reference to FIGS. 7 and 8. Write of data to the memory cell MC is performed by applying a certain voltage to the variable resistance element VR of the selected memory cell MC for a certain time. As a result, the variable resistance element VR of the selected memory cell MC changes from a high-resistance state to a low-resistance state. This operation for changing the variable resistance element VR from a high-resistance state to a low-resistance state is referred to below as a setting operation. Now, the setting operation in the present embodiment is assumed to be an operation for changing the variable resistance element VR from a high-resistance state to a low-resistance state by applying a setting voltage in a direction opposite to a current rectifying direction of the diode DI. The setting operation for changing the variable resistance element VR from a high-resistance state to a low-resistance state by applying a setting voltage in a direction opposite to a current rectifying direction of the diode DI is described below.

Figure 7:
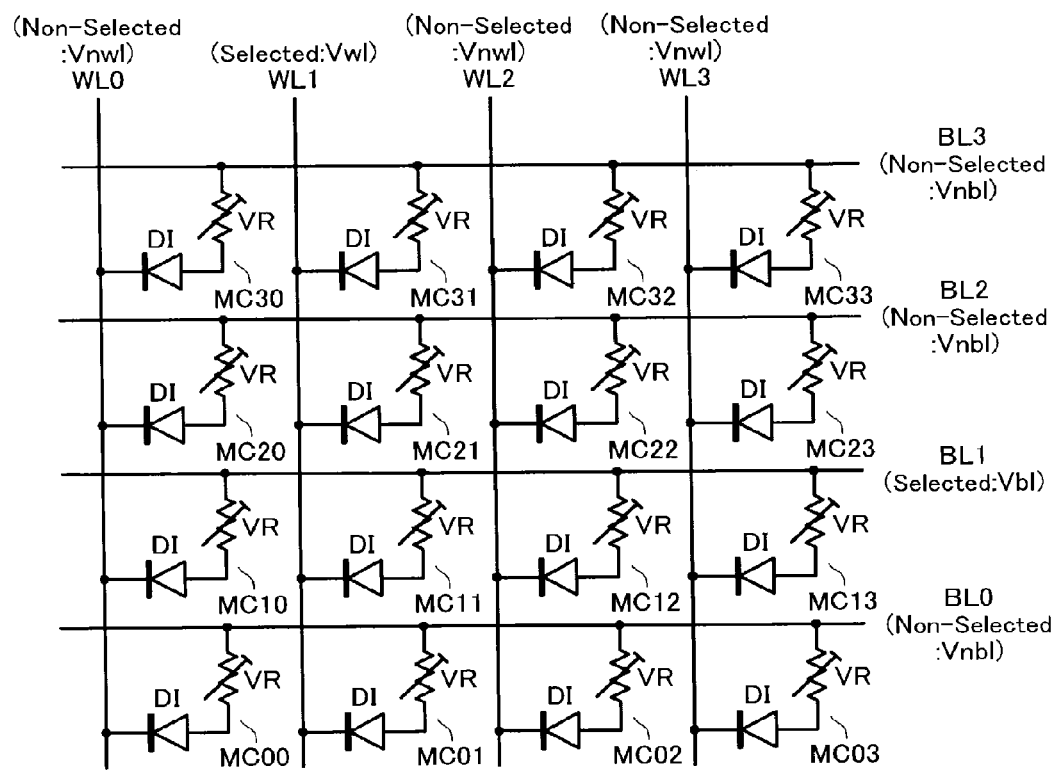
FIG. 7 is one example of a view showing a voltage application state during a setting operation in the first embodiment.

FIG. 7 is a view showing a voltage application state during the setting operation of the present embodiment. FIG. 7 shows the voltage application state when the setting operation is executed on a single-layer memory cell array 1. FIG. 8 is a diagram of voltage waveforms during the setting operation of the present embodiment.

Figure 8:
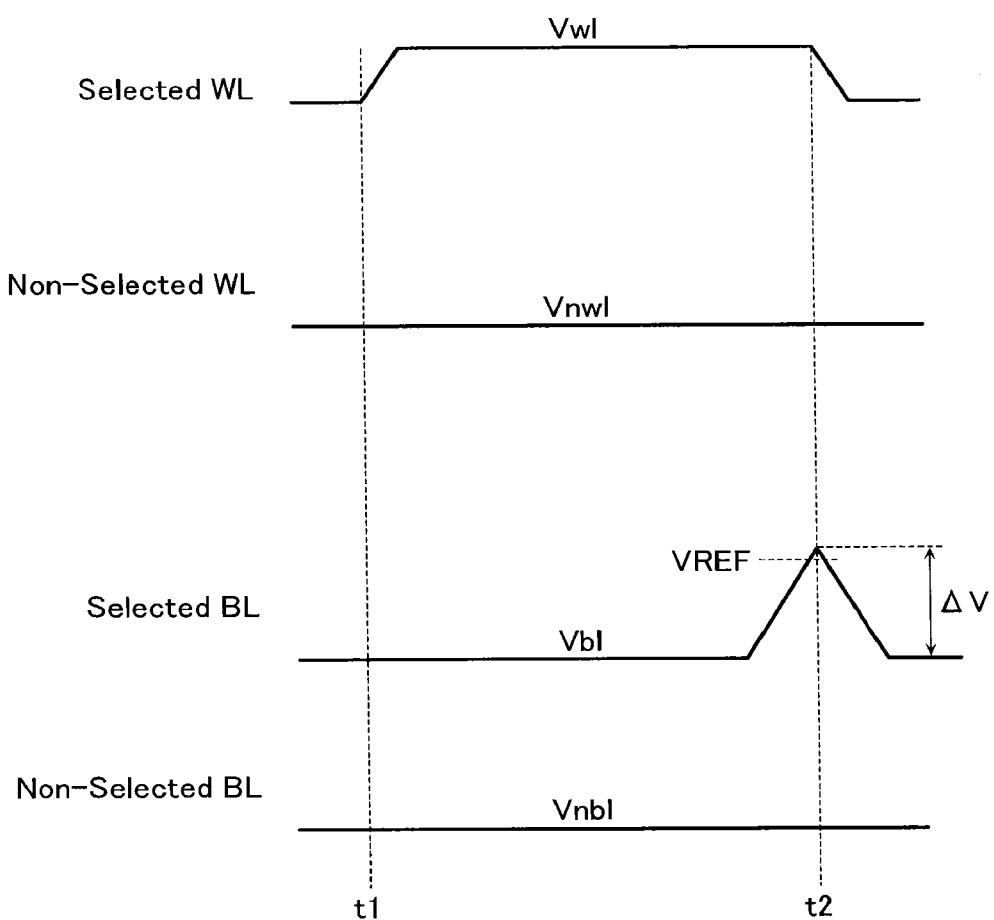
FIG. 8 is one example of a diagram of voltage waveforms during the setting operation of the present embodiment.

As shown in FIG. 8, in the setting operation of the present embodiment, a voltage Vnbl is applied to all the non-selected bit lines BL0, BL2, BL3. A voltage Vnwl is applied to all the non-selected word lines WL0, WL2, WL3. In addition, when the setting operation starts, a voltage Vbl is applied to the selected bit line BL1.

Next, at time t1, a voltage Vwl is applied to the selected word line WL1. Note that the voltage Vwl is a voltage having a certain positive voltage value. This results in a voltage Vwl-Vbl being applied to the selected memory cell MC11 connected to the selected bit line BL1 and the selected word line WL1 in an opposite direction to the current rectifying direction of the diode DI. In reality, there is a voltage drop in wiring lines and driver portions, but for simplicity, description proceeds here assuming there is no such voltage drop. Now, the voltage Vnbl and the voltage Vnwl are set to voltages of a degree appropriate to prevent false operation occurring in the non-selected memory cells MC. The voltage Vnbl and the voltage Vnwl may be identical voltages or may be different voltages.

The variable resistance element VR of the selected memory cell MC11 changes from a high-resistance state to a low-resistance state due to the voltage Vwl-Vbl. At that time, current flows from the selected word line WL1 to the selected bit line BL1 via the low-resistance state selected memory cell MC11, whereby the selected bit line BL1 rises by an amount of a voltage ΔV. When it is detected that the voltage of the selected bit line BL1 has exceeded a reference voltage VREF, at time t2, application of the voltage Vwl to the selected word line WL1 is suspended. The reference voltage VREF is set for the voltage change ΔV of the selected bit line BL1 to be appropriately detected. Then, voltage application to all wiring lines is suspended, whereby the setting operation is completed. The above description of the setting operation is for the case where voltage drop in the wiring lines and driver portions is negligibly small. However, when voltage drop in the wiring lines and driver portions is large, determination of the reference voltage VREF is difficult, as will be described later.

[Setting Operation in Stacked Memory Cell Array]

Figure 9:
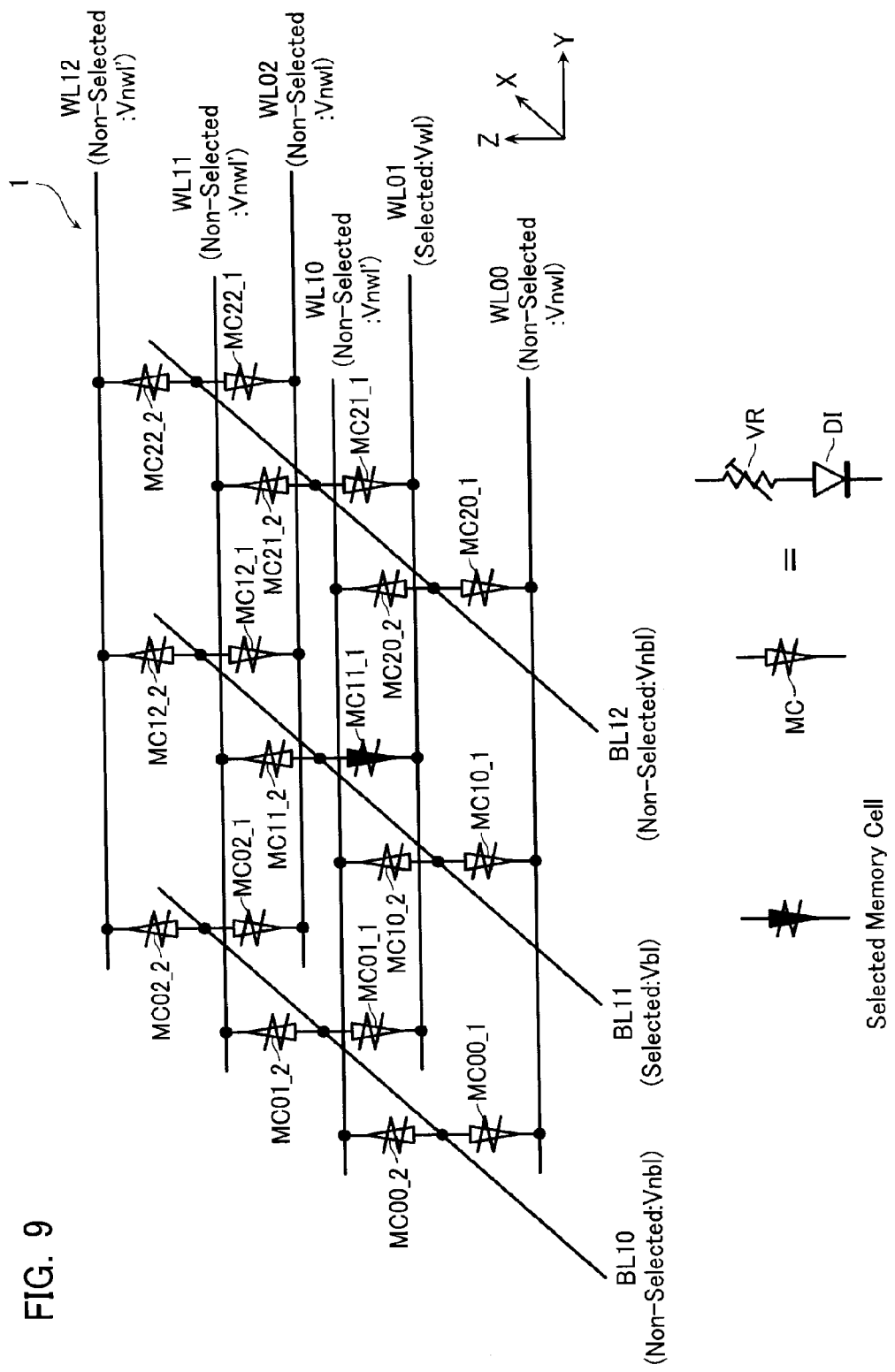
FIG. 9 is one example of a view showing a voltage application state during the setting operation in the first embodiment.

Next, one example of the setting operation on the memory cell array 1 provided with a plurality of cell array layers MA is described with reference to FIG. 9. FIG. 9 is a view showing a voltage application state during the setting operation of the present embodiment. In FIG. 9, the memory cell MC configured from the variable resistance element VR and the diode DI is shown by a triangular symbol as illustrated. A base end side and an apex side of the triangular symbol indicate, respectively, an anode and a cathode, and a direction from the anode toward the cathode indicates the current rectifying direction of the diode DI.

FIG. 9 shows the cell array layer MA1 and the cell array layer MA2. The cell array layer MA1 is provided between the word lines WL00, WL01, and WL02 and the bit lines BL10, BL11, and BL12, and the cell array layer MA2 is provided between the bit lines BL10, BL11, and BL12 and the word lines WL10, WL11, and WL12. In the example shown in FIG. 9, the setting operation is executed on the memory cell MC11_1 provided in the cell array layer MA1.

As shown in FIG. 9, during the setting operation, the voltage Vwl is applied to the selected word line WL01. In addition, the voltage Vbl is applied to the selected bit line BL11. As a result, in the ideal case where voltage drop in the wiring lines and driver portions is negligible, the voltage Vwl-Vbl is applied to the selected memory cell MC11_1 connected to the selected bit line BL11 and the selected word line WL01 in an opposite direction to the current rectifying direction of the diode DI. The variable resistance element VR of the selected memory cell MC11_1 changes from a high-resistance state to a low-resistance state due to this voltage Vwl-Vbl.

Now, during the setting operation, the voltage Vnbl is applied to all of the non-selected bit lines BL10, BL12. The voltage Vnwl is applied the non-selected word lines WL00, WL02 provided in the cell array layer MA1. A voltage Vnwl' is applied to the non-selected word lines WL10, WL11, WL12 provided in the cell array layer MA2. The voltage Vnbl, the voltage Vnwl, and the voltage Vnwl' may be identical, or may be different.

Figure 10:
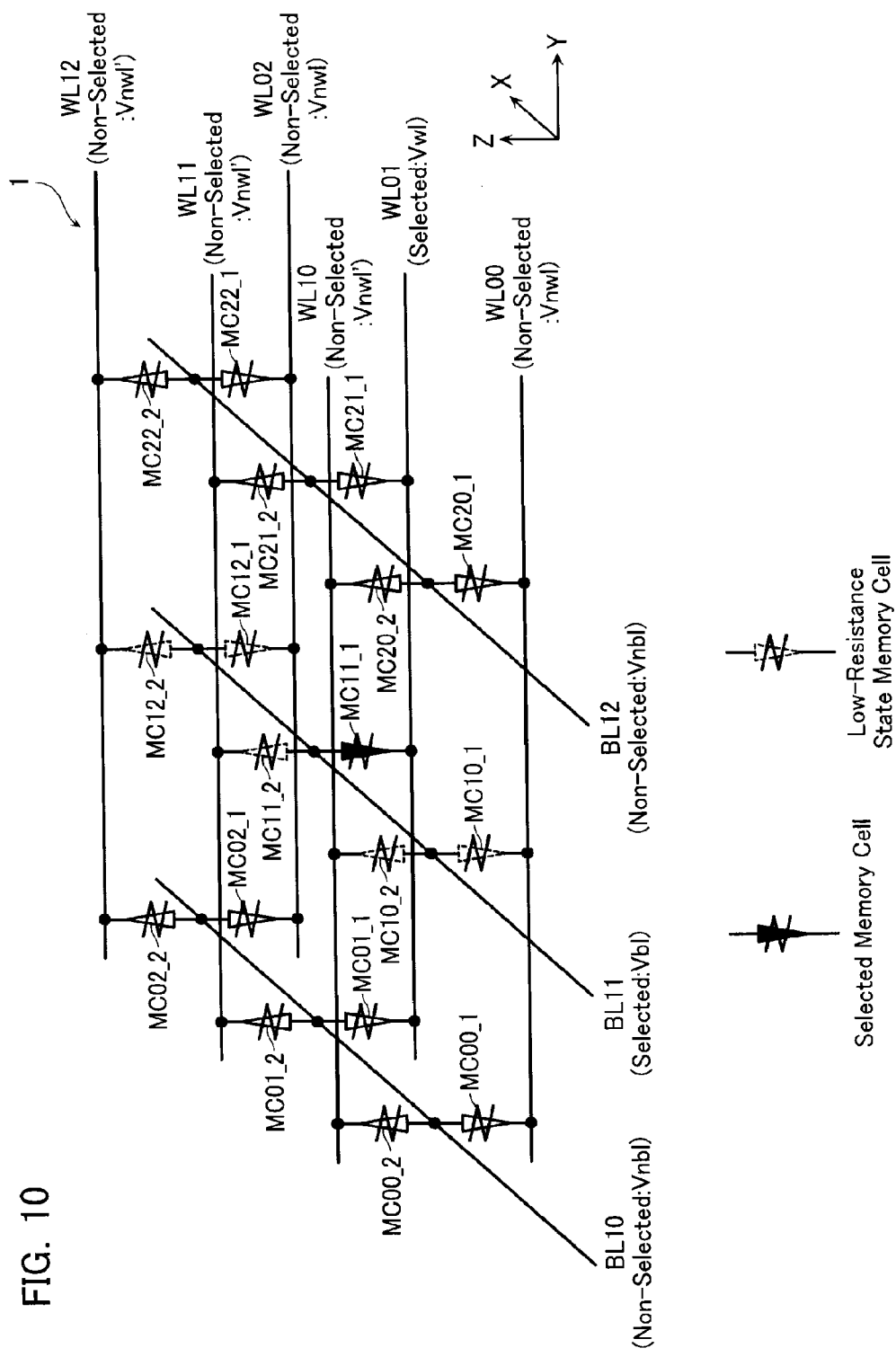
FIG. 10 is one example of a view showing a voltage application state during the setting operation in the first embodiment.

Now, during the setting operation on the memory cell array 1 provided with a plurality of cell array layers MA, a problem caused by the resistance state of the non-selected memory cells MC may occur in the operation. FIG. 10 is a view graph showing a voltage application state during the setting operation when there is a low-resistance state non-selected memory cell MC. In FIG. 10, the dotted line triangular symbol denotes the non-selected memory cell MC in the low-resistance state.

As shown in FIG. 10, during the setting operation, the voltage Vwl is applied to the selected word line WL01. In addition, the voltage Vbl is applied to the selected bit line BL11. Moreover, during the setting operation, the voltage Vnbl is applied to all of the non-selected bit lines BL10, BL12. In addition, the voltage Vnwl is applied to the non-selected word lines WL00, WL02 provided in the cell array layer MA1. The voltage Vnwl' is applied to the non-selected word lines WL10, WL11, WL12 provided in the cell array layer MA2.

Now, in the ideal case where voltage drop in the wiring lines and driver portions is negligible, a voltage Vnwl-Vbl is applied to the non-selected memory cells MC10_1 and MC12_1 connected between the non-selected word lines WL00 and WL02 and the selected bit line BL11 in an opposite direction to the current rectifying direction of the diode DI. Moreover, in the ideal case where voltage drop in the wiring lines and driver portions is negligible, a voltage Vnwl'-Vbl is applied to the non-selected memory cells MC10_2, MC11_2, and MC12_2 connected between the non-selected word lines WL10, WL11, and WL12 and the selected bit line BL11 in an opposite direction to the current rectifying direction of the diode DI. At this time, a leak current sometimes flows into the selected bit line BL11 via the non-selected memory cells MC10_1, MC12_1, MC10_2, MC11_2, and MC12_2, depending on a resistance state of the variable resistance element VR in the non-selected memory cells MC10_1, MC12_1, MC10_2, MC11_2, and MC12_2. Ideally, there is preferably no leak current regardless of the resistance state of the variable resistance element VR, but in reality, the leak current is anticipated to differ according to the resistance state of the variable resistance element VR. That is, if the resistance state of the variable resistance element VR lowers, the leak current increases.

For example, when the variable resistance element VR in the non-selected memory cells MC10_1, MC12_1, MC10_2, MC11_2, and MC12_2 is in a low-resistance state, the voltage of the selected bit line BL11 rises due to the leak current flowing via the non-selected memory cells MC10_1, MC12_1, MC10_2, MC11_2, and MC12_2. During the setting operation, a voltage change in the selected bit line BL11 based on a change in the resistance state of the selected memory cell MC11_1 is detected, but if a voltage change due to the leak current occurs, there is a possibility that the change in the resistance state of the selected memory cell MC11_1 cannot be accurately detected. In addition, an optimum value of the reference voltage VREF also differs according to the resistance state of the variable resistance element VR in the non-selected memory cells MC10_1, MC12_1, MC10_2, MC11_2, and MC12_2. In response to these problems, the semiconductor memory device according to the present embodiment executes a pre-read operation described below.

[Pre-read Operation]

Figure 11:
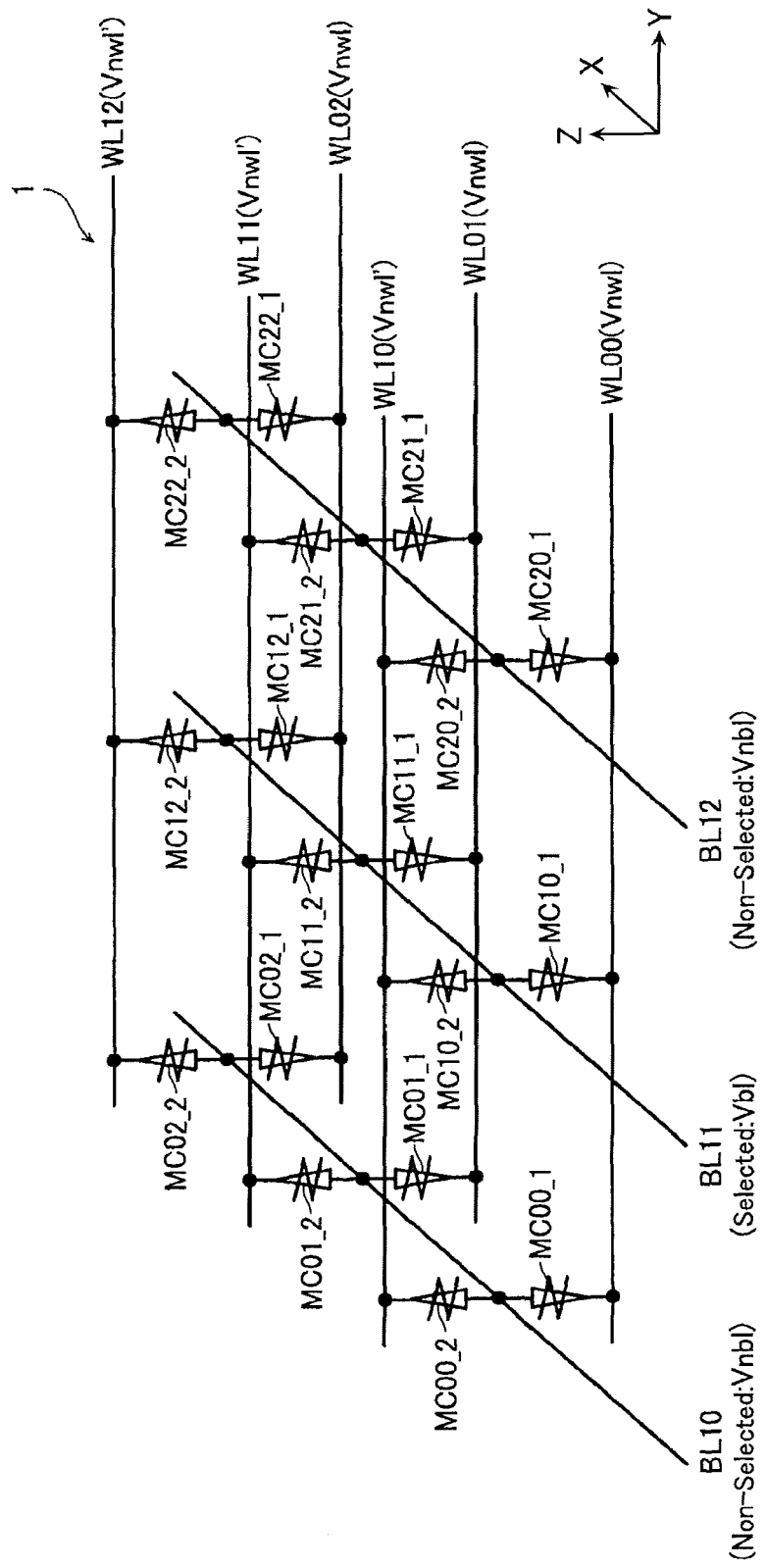
FIG. 11 is one example of a view showing a voltage application state during a pre-read operation in the first embodiment.

A pre-read operation according to the present embodiment is described below with reference to FIGS. 11 and 12. FIG. 11 is a view showing a voltage application state during the pre-read operation in the present embodiment. In addition, FIG. 12 is a view describing a control circuit in the present embodiment.

In the example shown in FIG. 11, the memory cell MC11_1 provided between the bit line BL11 and the word line WL01 is assumed to be selected during the latter performed setting operation. The pre-read operation is executed prior to the setting operation on this memory cell MC11_1. During the pre-read operation, the voltage Vbl substantially identical to that applied during the setting operation is applied to the bit line BL11 which is to become the selected bit line during the later performed setting operation.

Moreover, as shown in FIG. 11, during the pre-read operation, the voltage Vnbl substantially identical to that applied during the setting operation is applied to the bit lines BL10, BL12. The voltage Vnwl substantially identical to that applied during the setting operation is applied to the word lines WL00, WL01, WL02 including the selected word line WL01. Likewise, the voltage Vnwl' substantially identical to that applied during the setting operation is applied to the word lines WL10, WL11, WL12. The voltage applications during this pre-read operation cause voltages similar to those during the setting operation to be applied to the memory cells MC other than the memory cell MC11_1 which is to become the selected memory cell during the later setting operation.

Figure 12:
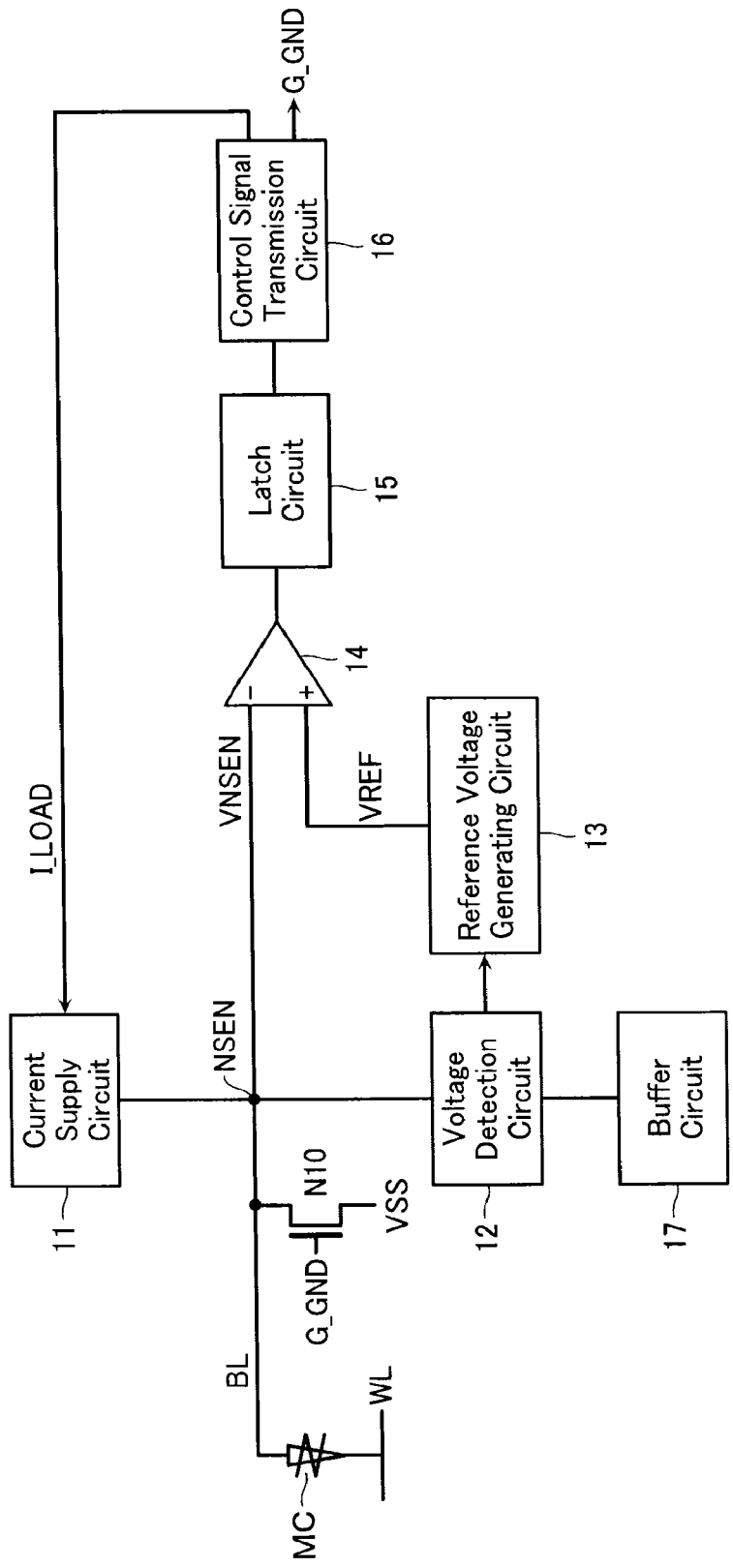
FIG. 12 is one example of a view describing a control circuit in the first embodiment.

Next, a configuration of the control circuit shown in FIG. 12, and control of the pre-read operation and the setting operation employing this control circuit are described. The control circuit shown in FIG. 12 is provided in the column control circuit 2 and used in the setting operation and the pre-read operation, for example. This control circuit comprises a current supply circuit 11, a voltage detection circuit 12, a reference voltage generating circuit 13, a sense amplifier 14, a latch circuit 15, a control signal transmission circuit 16, and a buffer circuit 17. The current supply circuit 11 supplies a current required in an operation to the bit line BL. The voltage detection circuit 12 detects the voltage of the bit line BL by detecting a voltage VNSEN of a node NSEN. The reference voltage generating circuit 13 generates the reference voltage VREF based on a voltage detection result of the voltage detection circuit 12. The sense amplifier 14 compares the voltage VNSEN of the node NSEN and the reference voltage VREF, and detects transition of the resistance state of the memory cell MC based on a magnitude relationship of these voltage VNSEN of the node NSEN and reference voltage VREF. The latch circuit 15 retains a detection result of the sense amplifier 14 temporarily, and sends the detection result to the control signal transmission circuit 16 or the buffer circuit 17. The control signal transmission circuit 16 transmits signals I_LOAD and G_GND to the current supply circuit 11 or a transistor N10 to control start and finish of an operation. The buffer circuit 17 can retain data of a voltage value of the bit line BL detected by the voltage detection circuit 12.

During the pre-read operation shown in FIG. 11, the voltage of the selected bit line BL11 is detected by the voltage detection circuit 12. As mentioned above, the pre-read operation causes voltages similar to those during the setting operation to be applied to the memory cells MC other than the memory cell MC11_1 which is to become the selected memory cell during the later setting operation. At this time, the voltage detection circuit 12 detects the voltage of the bit line BL11, and transmits that detection result to the reference voltage generating circuit 13. During the later performed setting operation, the reference voltage generating circuit 13 changes the value of the reference voltage VREF based on the voltage value of the bit line BL11 detected during the pre-read operation.

The reference voltage VREF generated by the reference voltage generating circuit 13 is set to a value such as to enable a voltage change ΔV of the selected bit line BL11 arising from the change in resistance state of the selected memory cell MC11_1 to be appropriately detected. For example, when there is no change in voltage of the bit line BL11 during the pre-read operation, the reference voltage VREF may be set to a value substantially identical to the voltage change ΔV of the selected bit line BL11 arising from the change in resistance state of the selected memory cell MC11_1 during the setting operation. On the other hand, when the bit line BL11 has changed to a voltage Vα during the pre-read operation, the reference voltage VREF may be set to a value substantially identical to the value that has the voltage Vα added to the voltage change ΔV of the selected bit line BL11 arising from the change in resistance state of the selected memory cell MC11_1 during the setting operation.

Any way of determining the value of the reference voltage VREF is acceptable, provided an appropriate value is set after the changed voltage Vα of the bit line BL11 during the pre-read operation is taken into consideration. During the setting operation in the present embodiment, the sense amplifier 14 detects transition of the resistance state of the selected memory cell MC, employing the value of the reference voltage VREF determined in such a manner. The detection result of the resistance state of the selected memory cell MC11_1 is sent to the control signal transmission circuit 16 via the latch circuit 15. The control signal transmission circuit 16, in the case of detecting that the selected memory cell MC11_1 has changed to a low-resistance state, suspends operation of the current supply circuit 11 by the signal I_LOAD and discharges the selected bit line BL11 and the selected word line WL01 via the transistor N10, thereby finishing the setting operation.

[Advantages]

When a leak current flows in the selected bit line BL from memory cells MC other than the selected memory cell MC in the pre-read operation, the voltage of the selected bit line BL changes as a result of the memory cells MC other than the selected memory cell MC also during the setting operation. During the setting operation, the voltage change in the selected bit line based on the change in resistance state of the selected memory cell MC is detected, but if a voltage change arising from memory cells MC other than the selected memory cell MC occurs, there is a possibility that the change in resistance state of the selected memory cell MC cannot be accurately detected.

To counter this, in the setting operation in the present embodiment, the value of the reference voltage VREF is changed based on the voltage value of the bit line BL detected during the pre-read operation. Changing the reference voltage VREF in view of the voltage change arising from memory cells MC other than the selected memory cell MC enables the voltage change in the selected bit line BL arising from the change in resistance state of the selected memory cell MC during the setting operation to be reliably detected. Therefore, the semiconductor memory device in the present embodiment can reliably detect change in the resistance state of the selected memory cell MC.

If an excessive voltage is applied to the variable resistance element VR employed in the memory cell MC, there is a risk of the variable resistance element VR being destroyed. However, setting the value of the reference voltage VREF based on the pre-read operation enables it to be appropriately detected that the resistance state of the variable resistance element VR has changed and thereby finish the operation. As a result, an excessive voltage is not applied to the variable resistance element VR employed in the memory cell MC, whereby destruction of the variable resistance element VR can be prevented.

[Second Embodiment]

Next, a second embodiment of the present invention is described with reference to FIGS. 13 and 14. An overall configuration of the semiconductor memory device in the present embodiment is similar to that in the first embodiment, hence a detailed description of the overall configuration is omitted. Moreover, places having configurations similar to those in the first embodiment are assigned with symbols identical to those assigned in the first embodiment and a duplicated description of such places is omitted. The above-described first embodiment described the setting operation and pre-read operation when there was one selected memory cell MC. The second embodiment below describes a procedure when executing the setting operation and pre-read operation on a plurality of selected memory cells MC.

[Operations in Present Embodiment]

Figure 13:
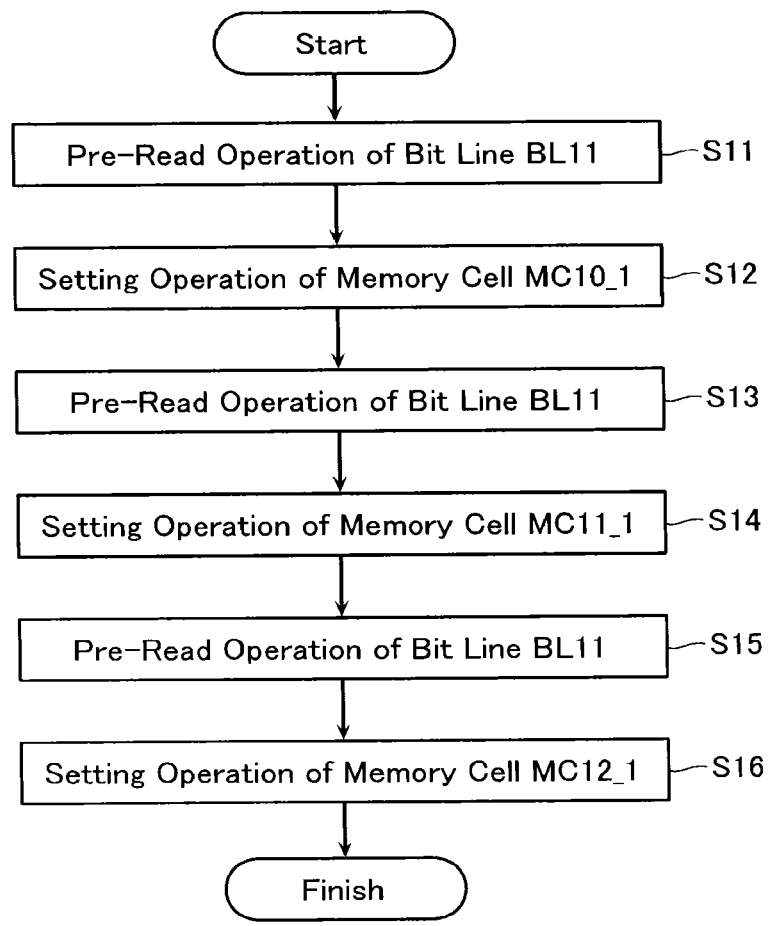
FIG. 13 is one example of a flowchart describing operations in a second embodiment.

FIG. 13 is one example of a flowchart describing a procedure when performing a pre-read operation and a setting operation in the present embodiment. FIG. 14 is one example of a view showing a selected memory cell during the setting operation in the present embodiment.

Figure 14:
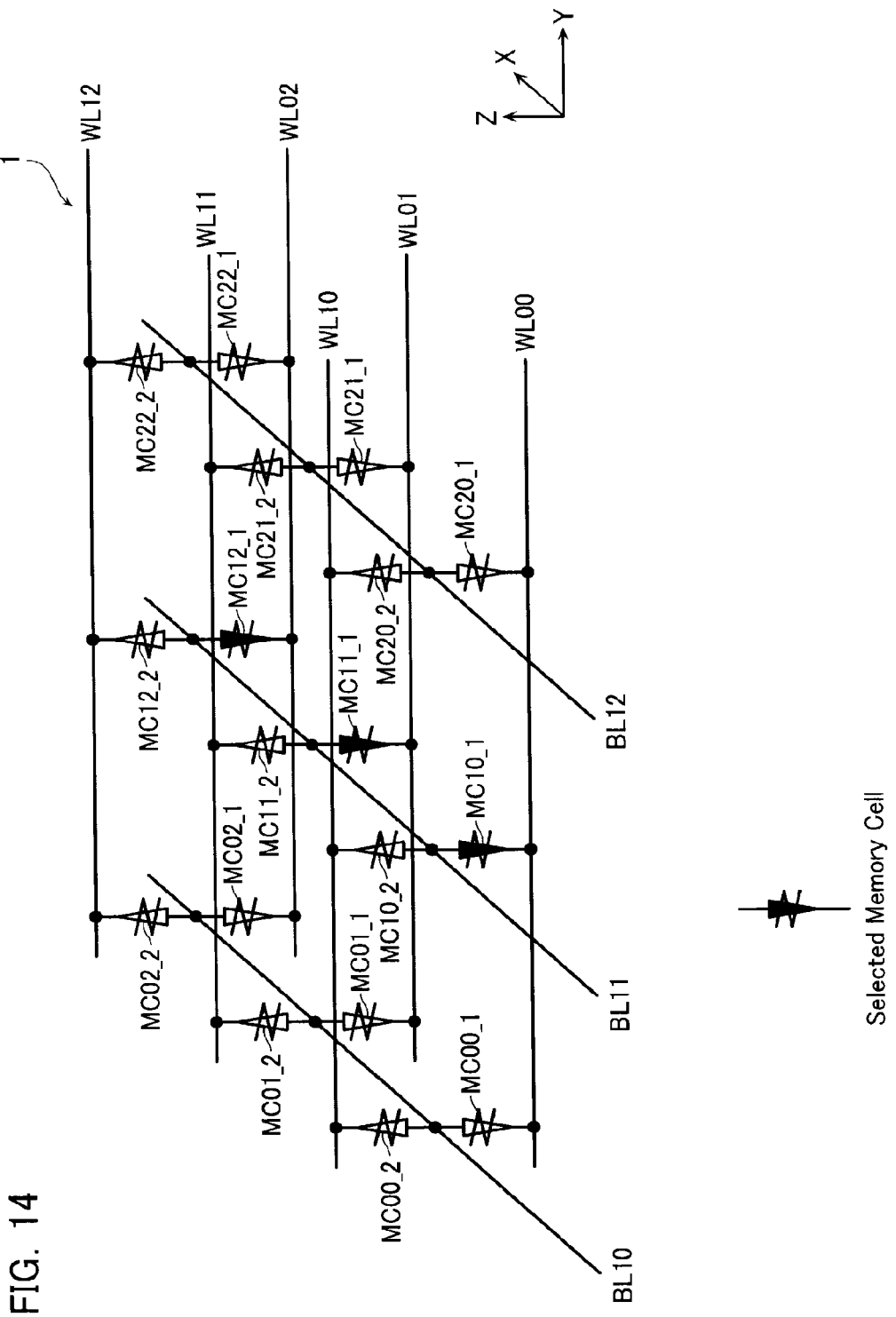
FIG. 14 is one example of a view showing a selected memory cell during a setting operation in the second embodiment.

As shown in FIG. 14, the setting operation in the present embodiment is executed on the memory cells MC10_1, MC11_1, and MC12_1 connected to the selected bit line BL11. At this time, the pre-read operation and the setting operation are executed on each of the selected memory cells MC on an individual basis. Description proceeds below with reference to the flowchart of FIG. 13.

When operation of the semiconductor memory device in the present embodiment is started, in step S11, the pre-read operation on the bit line BL11 is executed. This pre-read operation is similar to the pre-read operation in the first embodiment described using FIG. 11. Next, in step S12, the setting operation on the selected memory cell MC10_1 is executed. At this time, the voltage Vwl is applied to the selected word line WL00 and the voltage Vbl is applied to the selected bit line BL11. Due to the voltage Vwl-Vbl, the variable resistance element VR in the selected memory cell MC10_1 changes from a high-resistance state to a low-resistance state and the voltage of the selected bit line BL11 rises. If it is detected that the voltage of the selected bit line BL11 has exceeded the reference voltage VREF, the setting operation finishes. Now, the reference voltage VREF is set based on the pre-read operation on the bit line BL11 executed immediately before.

Thereafter, in step S13, the pre-read operation on the bit line BL11 is executed, and in step S14, the setting operation on the selected memory cell MC11_1 is executed. When it is detected that the voltage of the selected bit line BL11 has exceeded the reference voltage VREF, the setting operation finishes. Similarly, in step S15, the pre-read operation on the bit line BL11 is executed, and in step S16, the setting operation on the selected memory cell MC12_1 is executed. When it is detected that the voltage of the selected bit line BL11 has exceeded the reference voltage VREF, the setting operation finishes. The reference voltage VREF during the setting operations on the selected memory cells MC11_1 and MC12_1 is set based on the pre-read operation on the bit line BL11 executed immediately before each of the setting operations.

[Advantages]

In the setting operation in the present embodiment, the value of the reference voltage VREF is changed based on the voltage value of the bit line BL detected during the pre-read operation. Changing the reference voltage VREF in view of the voltage change arising from memory cells MC other than the selected memory cell MC enables the voltage change in the selected bit line BL arising from the change in resistance state of the selected memory cell MC during the setting operation to be reliably detected. Therefore, the semiconductor memory device in the present embodiment can reliably detect change in the resistance state of the selected memory cell MC.

Moreover, in the procedure of the setting operation and the pre-read operation in the present embodiment, a pre-read operation is performed before the setting operation is executed, on each of the selected memory cells MC. This enables an appropriate reference voltage VREF to be set for each of the selected memory cells MC, thereby reducing the possibility of an erroneous in an operation.

[Third Embodiment]

Next, a third embodiment of the present invention is described with reference to FIGS. 15 and 16. An overall configuration of the semiconductor memory device in the present embodiment is similar to that in the first embodiment, hence a detailed description of the overall configuration is omitted. Moreover, places having configurations similar to those in the first embodiment are assigned with symbols identical to those assigned in the first embodiment and a duplicated description of such places is omitted. The third embodiment below also describes a procedure when executing the setting operation and pre-read operation on a plurality of selected memory cells MC.

[Operations in Present Embodiment]

Figure 15:
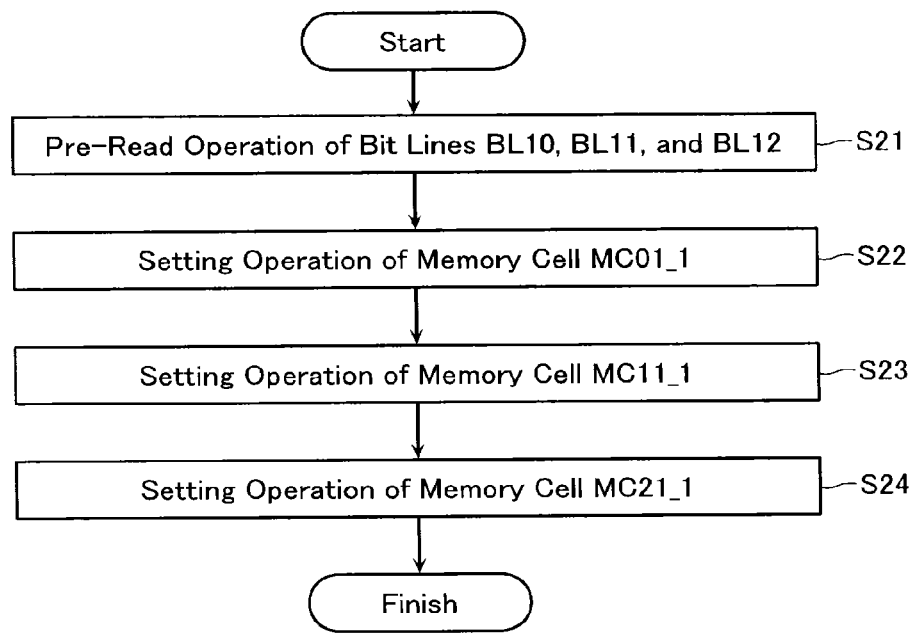
FIG. 15 is one example of a flowchart describing operations in a third embodiment.

FIG. 15 is one example of a flowchart describing a procedure when performing a pre-read operation and a setting operation in the present embodiment. FIG. 16 is one example of a view showing a selected memory cell during the setting operation in the present embodiment.

Figure 16:
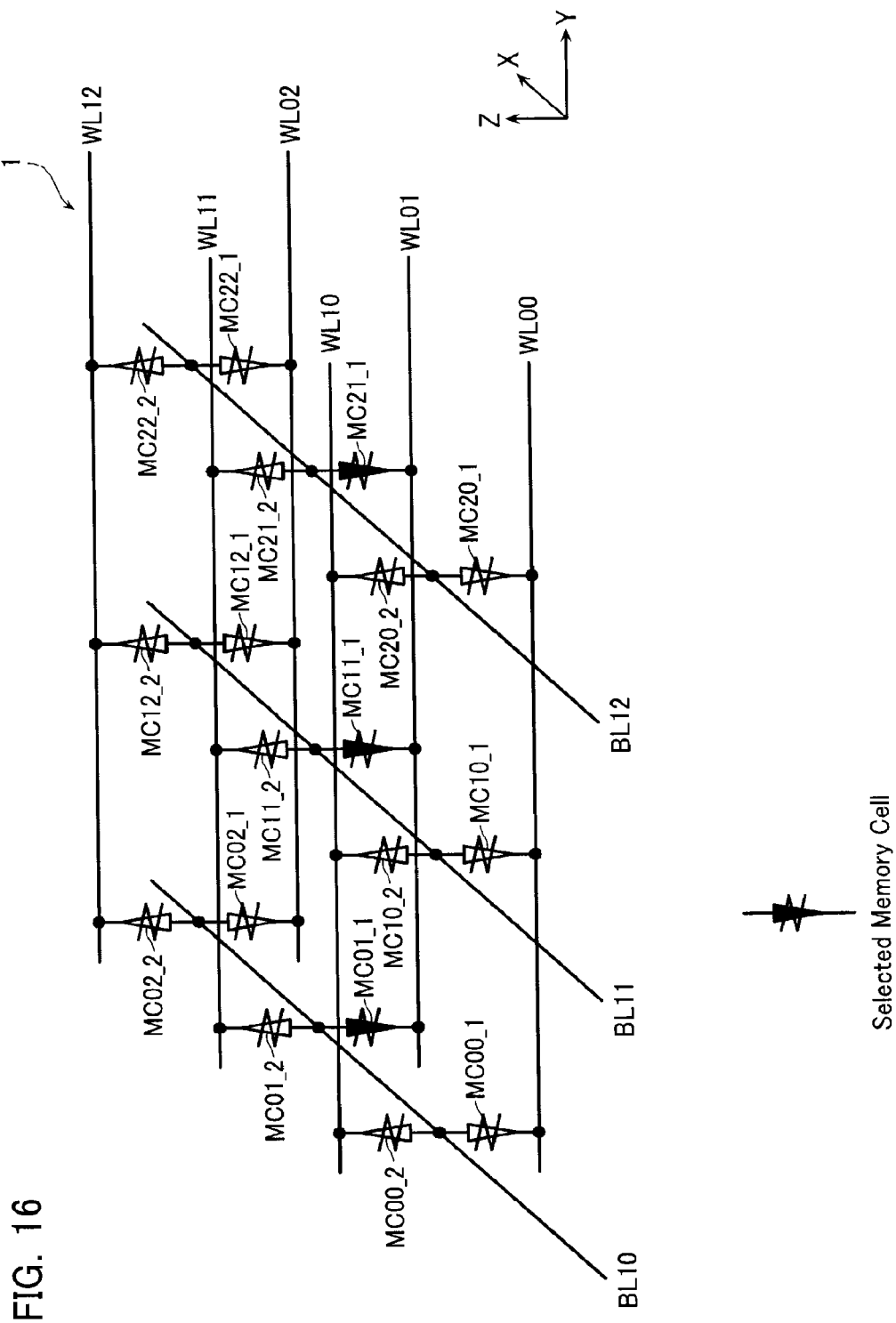
FIG. 16 is one example of a view showing a selected memory cell during a setting operation in the third embodiment.

As shown in FIG. 16, the setting operation in the present embodiment is executed on the memory cells MC01_1, MC11_1, and MC21_1 connected to the selected word line WL01. At this time, the pre-read operation is executed on the bit lines BL10, BL11, and BL12 prior to the setting operation on the selected memory cells MC01_1, MC11_1, and MC21_1. Description proceeds below with reference to the flowchart of FIG. 15.

When operation of the semiconductor memory device in the present embodiment is started, in step S21, the pre-read operation on each of the bit lines BL10, BL11, and BL12 is respectively executed. This pre-read operation is an operation that performs the pre-read operation in the first embodiment described using FIG. 11, a plurality of times, changing the selected bit line BL. A value of the voltage of each of the bit lines BL10, BL11, and BL12 read by this pre-read operation is, for example, retained in the buffer circuit 17 in the control circuit. The value of the reference voltage VREF during the setting operation is set for each of the bit lines BL10, BL11, and BL12 based on the value of the voltage of each of the bit lines BL10, BL11, and BL12 in this pre-read operation.

Next, in step S22, the setting operation on the selected memory cell MC01_1 is executed. At this time, the voltage Vwl is applied to the selected word line WL01 and the voltage Vbl is applied to the selected bit line BL10. Due to the voltage Vwl-Vbl, the variable resistance element VR in the selected memory cell MC01_1 changes from a high-resistance state to a low-resistance state and the voltage of the selected bit line BL10 rises. When it is detected that the voltage of the selected bit line BL10 has exceeded the reference voltage VREF, the setting operation finishes. Now, the reference voltage VREF is set based on the pre-read operation executed in advance on the bit line BL10.

Thereafter, in step S23, the setting operation on the selected memory cell MC11_1 is executed, and in step S24, the setting operation on the selected memory cell MC21_1 is executed. The reference voltage VREF during the setting operation on the selected memory cells MC11_1 and MC21_1 is respectively set based on the pre-read operation executed in advance on each of the bit lines BL11 and BL12.

Note that when executing the setting operation on a plurality of memory cells MC connected to one bit line BL, an identical value of the reference voltage VREF which is set based on the pre-read operation executed on that bit line BL, is employed.

[Advantages]

In the setting operation in the present embodiment, the value of the reference voltage VREF is adjusted based on the voltage value of the bit line BL detected during the pre-read operation. By changing the reference voltage VREF in view of the voltage change caused by memory cells MC other than the selected memory cell MC, the voltage change in the selected bit line BL caused by the change in resistance state of the selected memory cell MC during the setting operation is reliably detected. Therefore, the semiconductor memory device in the present embodiment can reliably detect change in the resistance state of the selected memory cell MC.

Moreover, in the procedure of the setting operation and the pre-read operation in the present embodiment, the pre-read operation is performed in advance on all of the bit lines BL. The reference voltage VREF during the setting operation is set for each of the bit lines BL based on this pre-read operation. When executing the setting operation on a plurality of memory cells MC connected to one bit line BL, the pre-read operation is not executed for each memory cell MC, hence time required for the setting operation can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
    a memory cell array including,
    a plurality of first lines disposed above a substrate,
    a plurality of second lines disposed intersecting the first lines, and
    variable resistance elements disposed at each of intersections of the first lines and the second lines; and
    a control circuit configured to apply a first voltage to a selected first line, apply a second voltage having a voltage value which is smaller than that of the first voltage to a selected second line, and apply a third voltage and a fourth voltage to a non-selected first line and a non-selected second line in a setting operation, respectively, such that a first potential difference is applied to a selected variable resistance element disposed at the intersection of the selected first line and the selected second line, the control circuit including a detection circuit configured to, during the setting operation, detect a transition of a resistance state of the selected variable resistance element using a reference voltage, and the control circuit being configured to, before the setting operation, execute a read operation in which the control circuit applies the third voltage to the selected first line and the non-selected first line, and applies the second voltage to the selected second line, and set the reference voltage based on a voltage value of the selected second line during the read operation.

2. The semiconductor memory device according to claim 1, wherein
the detection circuit configured to detect a transition of a resistance state of the selected variable resistance element using the reference voltage and a voltage value of the selected second line during the setting operation.

3. The semiconductor memory device according to claim 2, further comprising
a current rectifier element disposed at intersection of one of the first lines and one of the second lines, and the current rectifier element is connected to one of the variable resistance element in series.

4. The semiconductor memory device according to claim 2, wherein
the control circuit being configured to, before the setting operation, execute a read operation in which the control circuit applies the third voltage to the selected first line and the non-selected first line, applies the second voltage to the selected second line, and applies the fourth voltage to the non-selected second line, and set the reference voltage based on a voltage value of the selected second line during the read operation.

5. The semiconductor memory device according to claim 1, wherein
the control circuit is configured to, when executing the setting operation on a plurality of the selected variable resistance elements, execute the read operation and the setting operation on each single one of the selected variable resistance elements.

6. The semiconductor memory device according to claim 1, wherein
the control circuit is configured to, before the setting operation on a plurality of the selected variable resistance elements, detect voltage values of a plurality of the selected second lines by a plurality of times of the read operation.

7. The semiconductor memory device according to claim 1, wherein
a plurality of the memory cell arrays are stacked in a direction perpendicular to the substrate.

8. The semiconductor memory device according to claim 1, wherein
the variable resistance element changes from a high-resistance state to a low-resistance state by the first potential difference.

9. The semiconductor memory device according to claim 1, wherein
the third voltage and the fourth voltage are an identical voltage.

10. A method of operating a semiconductor memory device,
the semiconductor memory device comprising a memory cell array including a plurality of first lines disposed above a substrate, a plurality of second lines disposed intersecting the first lines, and variable resistance elements disposed at each of intersections of the first lines and the second lines and each configured having a variable resistance element, and the semiconductor memory device configured to execute a setting operation in which a first voltage is applied to a selected first line, a second voltage having a voltage value which is smaller than that of the first voltage is applied to a selected second line, a third voltage is applied to a non-selected first line, and a fourth voltage is applied to a non-selected second line respectively, such that a first potential difference is applied to a selected variable resistance element disposed at the intersection of the selected first line and the selected second line, the method comprising:
before the setting operation, executing a read operation in which the third voltage is applied to the selected first line and the non-selected first line, and the second voltage is applied to the selected second line, and setting a reference voltage based on a voltage value of the selected second line during the read operation; and during the setting operation, detecting a transition of a resistance state of the selected variable resistance element using the reference voltage.

11. The method of operating a semiconductor memory device according to claim 10, wherein
during the setting operation, detecting a transition of a resistance state of the selected variable resistance element using the reference voltage and a voltage value of the selected second line during the setting operation.

12. The method of operating a semiconductor memory device according to claim 11, further comprising
a current rectifier element disposed at intersection of one of the first lines and one of the second lines, and the current rectifier element is connected to one of the variable resistance element in series.

13. The method of operating a semiconductor memory device according to claim 11, wherein
before the setting operation, executing a read operation in which the third voltage is applied to the selected first line and the non-selected first line, the second voltage is applied to the selected second line, and the fourth voltage is applied to the non-selected second line, and setting a reference voltage based on a voltage value of the selected second line during the read operation.

14. The method of operating a semiconductor memory device according to claim 10, wherein
when the setting operation is executed on a plurality of the selected variable resistance elements, the read operation and the setting operation are executed on each single one of the selected variable resistance elements.

15. The method of operating a semiconductor memory device according to claim 10, wherein
before the setting operation on a plurality of the selected variable resistance elements, voltage values of a plurality of the selected second lines are detected by a plurality of times of the read operation.

16. The method of operating a semiconductor memory device according to claim 10, wherein the variable resistance element changes from a high-resistance state to a low-resistance state by the first potential difference.

17. The method of operating a semiconductor memory device according to claim 10, wherein
the third voltage and the fourth voltage are an identical voltage.

\* \* \* \* \*